United States Patent [19]
Ashby

[11] Patent Number: 6,020,786
[45] Date of Patent: Feb. 1, 2000

[54] TEMPERATURE COMPENSATION FOR VARIABLE GAIN AMPLIFIERS

[75] Inventor: Kirk B. Ashby, Reading, Pa.

[73] Assignee: Lucent Technologies Inc., Murray Hill, N.J.

[21] Appl. No.: 09/128,032

[22] Filed: Aug. 3, 1998

[51] Int. Cl.[7] ....................................................... H03F 3/45
[52] U.S. Cl. ........................................... 330/256; 327/359
[58] Field of Search ..................................... 330/254, 256, 330/289; 327/359

[56] References Cited

U.S. PATENT DOCUMENTS

| | | | |
|---|---|---|---|
| 5,030,924 | 7/1991 | Fritz | 330/256 |
| 5,471,173 | 11/1995 | Moore et al. | 330/256 |

OTHER PUBLICATIONS

"Bipolar and MOS Analog Integrated Circuit Design", by Alan B. Grebene, 1984 A Wiley–Interscience Publication by John Wiley & Sons, Inc., 4 pgs.

"Analogue IC Design: The Current–Mode Approach", edited by C. Toumazou, F.J. Lidgey, and D.G. Haigh, 1990 Peter Peregrinus Ltd., IEE, London, UK, pp. 74–77.

"Analysis and Design and Analog Integrated Circuits", by P. Gray and R. Meyer, 1993, pp. 338–347.

*Primary Examiner*—Steven J. Mottola

[57] ABSTRACT

A variable gain amplifier (VGA) may be useful in applications where the input amplitude is constant but the output must vary over a wide range. Some VGAs have a desirable exponential control characteristic, but an undesirable temperature characteristic that causes the gain to change with temperature when the control voltage is held constant with respect to temperature. The present invention is directed to a circuit that will convert a control signal (e.g., a voltage) that is constant with temperature into a voltage that can be applied to a VGA in such a way that the temperature variation of the VGA is eliminated without changing the desirable exponential control characteristics.

20 Claims, 2 Drawing Sheets

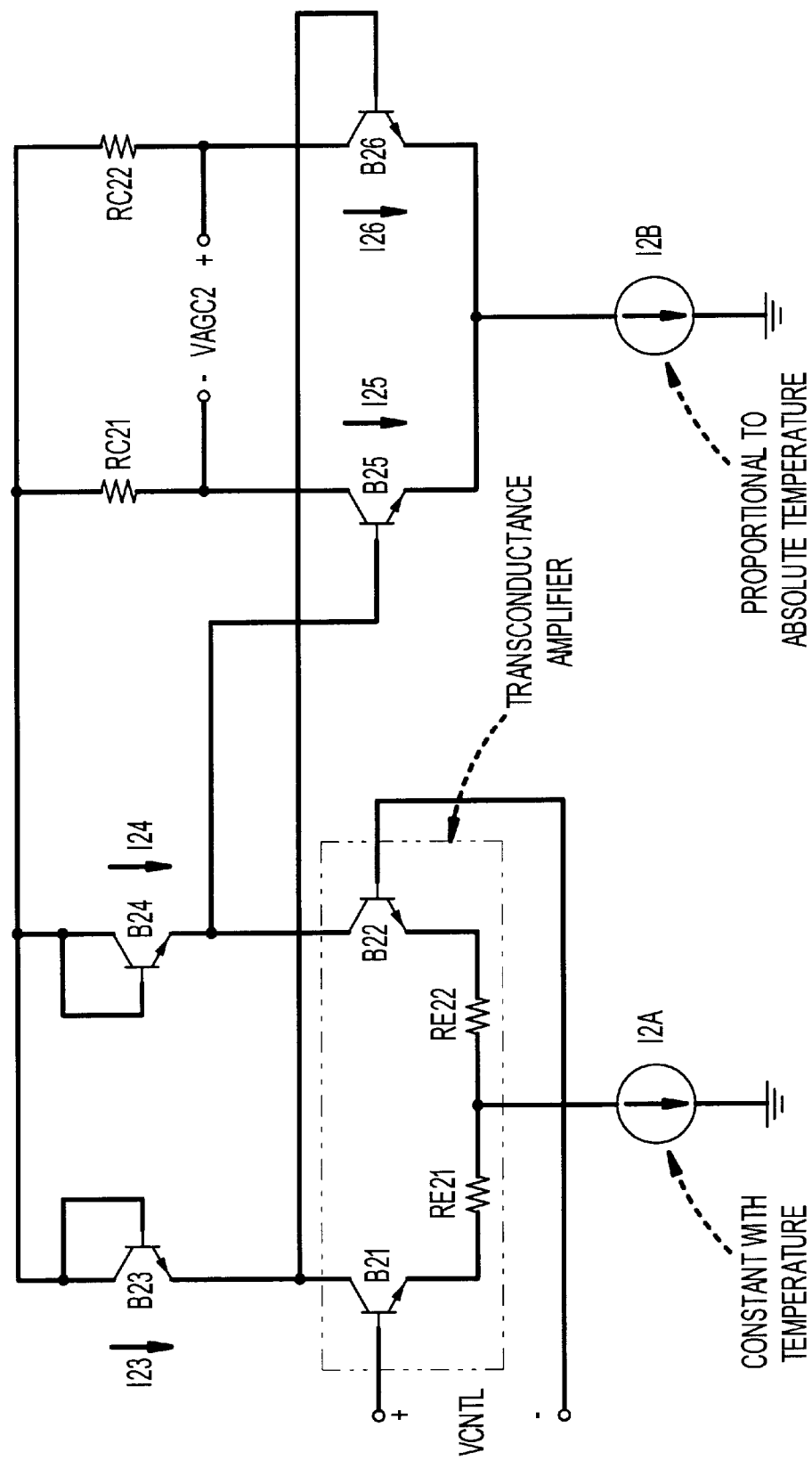

TEMPERATURE COMPENSATION FOR VARIABLE GAIN AMPLIFIERS

BACKGROUND OF THE INVENTION

1. Field of the Invention

The present invention relates to integrated circuits, and, in particular, to variable gain amplifiers.

2. Description of the Related Art

The variable gain amplifier (VGA) shown in FIG. 1 has been used for many years and is particularly useful in applications where the input is at a constant amplitude, but the output level must vary over a wide range. The circuit has excellent high-frequency performance and its distortion performance is independent of the gain setting (to first order). Assuming that RC11=RC12=RC1, and RE11=RE12=RE1, it can be shown that the voltage gain $A_V$ of the circuit is given by Equation (1) as follows:

$$A_V = \frac{RC1}{RE1} \frac{1}{1 + \exp\left(VAGC1 / \frac{kT}{q}\right)} \quad (1)$$

where VAGC1 is the VGA control voltage, T=absolute temperature, k=Boltzman's constant, and q=fundamental electron charge.

A desirable feature of this VGA is that the gain control has an exponential characteristic. An undesirable characteristic is that, when the control voltage VAGC1 is constant with temperature (as is typically the case), the gain of the amplifier will have a strong temperature dependence. The temperature dependence is a result of the kT/q term in Equation (1).

SUMMARY OF THE INVENTION

The present invention is directed to a scheme for temperature compensating a variable gain amplifier, such as the VGA of FIG. 1. In one embodiment, the present invention is an integrated circuit comprising (a) a temperature-dependent VGA and (b) a temperature-compensation circuit configured to provide a temperature-dependent control voltage to the VGA to substantially compensate for the temperature dependence of the VGA.

BRIEF DESCRIPTION OF THE DRAWINGS

Other aspects, features, and advantages of the present invention will become more fully apparent from the following detailed description, the appended claims, and the accompanying drawings in which:

FIG. 2 shows a temperature compensation circuit for the VGA of FIG. 1, according to one embodiment of the present invention.

DETAILED DESCRIPTION

Figure 1:
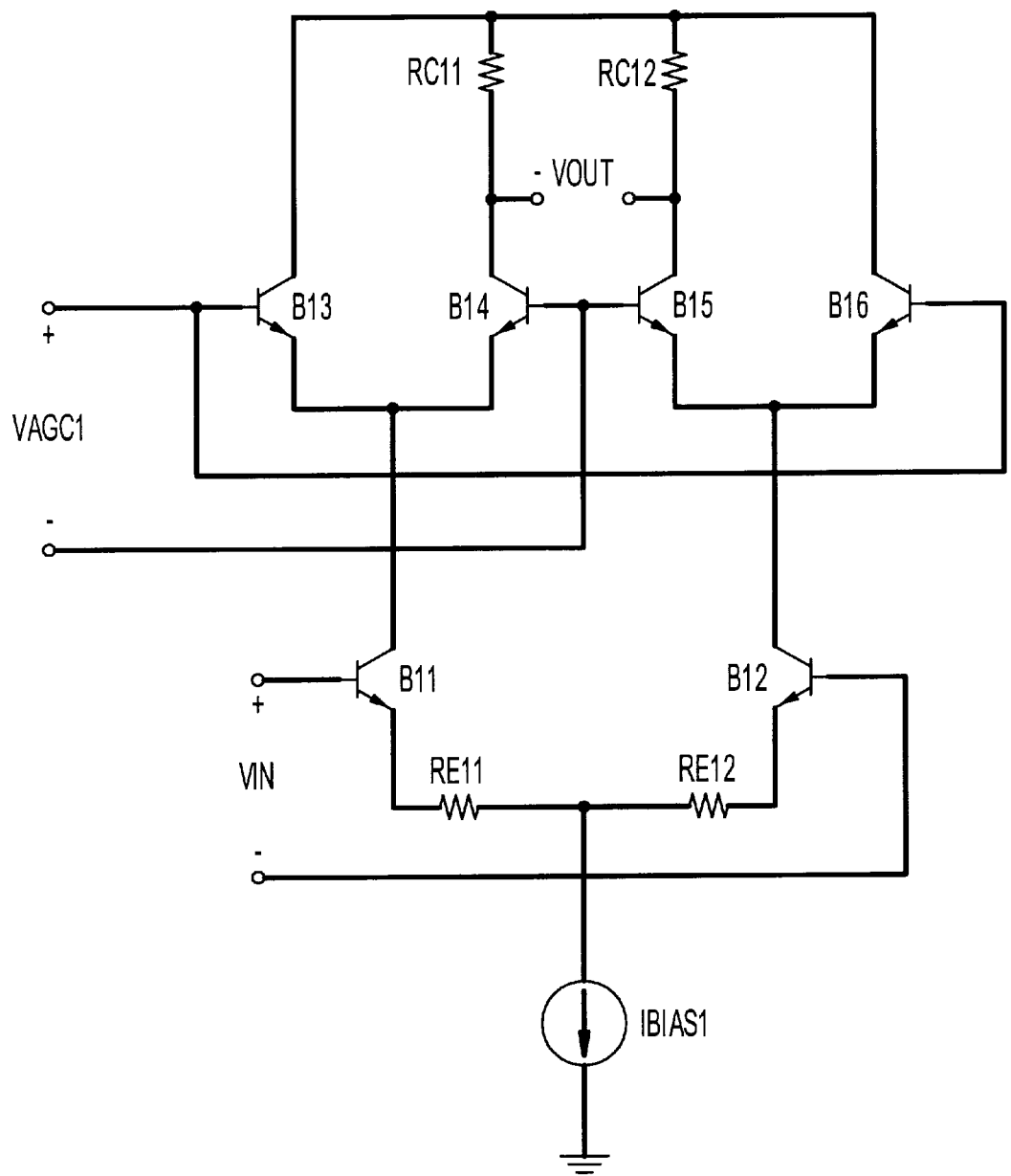
FIG. 1 shows a prior art variable gain amplifier.

To provide temperature compensation for a temperature-dependent variable gain amplifier, such as the VGA of FIG. 1, without changing the desirable exponential characteristics, a circuit is needed that will create a control voltage VAGC1 that is proportional to temperature and controllable by the user. The following Equation (2) for VAGC1 will meet the requirements:

$$VAGC1 = M \cdot T \cdot VCNTL \quad (2)$$

where M is an arbitrary constant, T is absolute temperature, and VCNTL is a user-controlled, temperature-independent control voltage. When VAGC1 is of the form specified in Equation (2), rather than constant with temperature, Equation (1), and thus the VGA of FIG. 1, becomes temperature independent.

FIG. 2 shows a circuit that will generate a voltage VAGC2 of the form in Equation (2) that can be used as the control voltage VAGC1 for the VGA of FIG. 1. The transconductance amplifier formed by transistors B21 and B22 and resistors RE21 and RE22 is used to convert the input voltage VCNTL to an input current in a linear fashion. The topology shown in the dotted box is an example of one possible implementation of a transconductance amplifier. Other implementations may be employed as desired.

Employing Kirchoff's voltage law to the loop formed by transistors B23, B24, B25, and B26 yields Equation (3) as follows:

$$VBE23 - VBE24 - VBE25 + VBE26 = 0 \quad (3)$$

where VBE23, VBE24, VBE25, and VBE26 represent the emitter-base voltages of transistors B23, B24, B25, and B26, respectively.

Substituting in the diode equation for each emitter-base voltage in Equation (3) yields Equation (4) as follows:

$$\frac{kT}{q}\ln\left(\frac{I23}{IS23}\right) - \frac{kT}{q}\ln\left(\frac{I24}{IS24}\right) - \frac{kT}{q}\ln\left(\frac{I25}{IS25}\right) + \frac{kT}{q}\ln\left(\frac{I26}{IS26}\right) = 0 \quad (4)$$

where I23, I24, I25, and I26 are the collector currents of transistors B23, B24, B25, and B26, respectively, and IS23, IS24, IS25, and IS26 are the respective saturation currents for the same transistors.

Assuming that IS23=IS24=IS1, and IS25=IS26=IS2, then Equation (4) can be rewritten as Equation (5) as follows:

$$\frac{kT}{q}\ln\left(\frac{I23 \cdot I26}{IS1 \cdot IS2}\right) = \frac{kT}{q}\ln\left(\frac{I24 \cdot I25}{IS1 \cdot IS2}\right) \quad (5)$$

From Equation (5), Equation (6) follows:

$$I23 \cdot I26 = I24 \cdot I25 \quad (6)$$

Assuming a good transconductance amplifier, that RE21=RE22=RE2, and that RC21=RC22=RC2, Equations (7)–(10) as follows are true for the circuit in FIG. 2:

$$\frac{VCNTL}{RE2} = I23 - I24 \quad (7)$$

$$I23 + I24 = I2A \quad (8)$$

$$I25 + I26 = I2B \quad (9)$$

$$VAGC2 = RC2(I25 - I26) \quad (10)$$

Applying Equation (6) to the ratio of Equations (9) and (8) yields Equation (11) as follows:

$$\frac{I2B}{I2A} = \frac{I25 + I26}{I23 + I24} = \frac{I26\frac{I23}{I24} + I26}{I23 + I24} = \frac{I26}{I24}\left(\frac{I23 + I24}{I23 + I24}\right) = \frac{I26}{I24} \quad (11)$$

Applying Equation (6) to Equation (10) yields Equation (12) as follows:

$$VAGC2 = \qquad (12)$$

$$RC2(I25 - I26) = RC2\left(I26\frac{I23}{I24} - I26\right) = RC2\left(\frac{I26}{I24}\right)(I23 - I24)$$

Applying Equations (11) and (7) to Equation (12) yields Equation (13) as follows:

$$VAGC2 = RC2\left(\frac{I26}{I24}\right)(I23 - I24) = \frac{RC2}{RE2}\left(\frac{I2B}{I2A}\right)VCNTL \qquad (13)$$

Equation (13) is nearly of the form of Equation (2). If the current source I2A is designed such that it is constant with temperature, and if current source I2B is designed such that it is proportional to absolute temperature, the desired form of Equation (2) is obtained. Let I2B/I2A=T*C where C is an arbitrary constant. Substituting this relationship into Equation (13) yields Equation (14) as follows:

$$VAGC2 = \frac{RC2}{RE2}(T \cdot C)VCNTL = M \cdot T \cdot VCNTL \qquad (14)$$

where the constant M is given by Equation (15) as follows:

$$M = C \cdot RC2/RE2 \qquad (15)$$

Equation (14) has the same form as Equation (2). As such, the circuit of FIG. 2 can be used to temperature stabilize a variable gain amplifier, such as the VGA of FIG. 1, as long as the ratio I2B/I2A is substantially proportional to absolute temperature over the temperature operating range of the circuit. In one embodiment, this criterion can be achieved by implementing the circuit with a current source I2A that is sufficiently constant with temperature and a current source I2B that is sufficiently proportional to absolute temperature. Designing current sources with these temperature characteristics is easily done using well established techniques. When the output VAGC2 of the circuit of FIG. 2 is used as the input VAGC1 for the circuit of FIG. 1, the resultant amplifier will be temperature stable and will maintain its desirable exponential control characteristics.

A ratio I2B/I2A that is proportional to absolute temperature can also be achieved using alternative embodiments. For example, if current source I2B is constant with temperature, while current source I2A is inversely proportional to absolute temperature, then the ratio I2B/I2A will be proportional to absolute temperature. Similarly, if current source I2A is proportional to absolute temperature, while current source I2B is proportional to the square of absolute temperature, then the ratio I2B/I2A will again be proportional to absolute temperature. Those skilled in the art will understand that, in theory, by extending these examples, the direct temperature dependence of the ratio I2B/I2A can be achieved in any number of different ways.

The fundamental requirement for temperature compensation is given by Equation (2). According to Equation (2), if the differential control voltage VAGC2 for the VGA is proportional to absolute temperature, then temperature variation in the gain will be eliminated. For a fixed control signal value, it is desirable that the gain of the VGA be constant over temperature. In order to accomplish this, the circuit of FIG. 2 may be used to convert a temperature-independent control signal into the differential control signal VAGC2 used by the VGA for temperature stability.

In the embodiment of FIG. 2, the input control signal VCNTL is a voltage. In alternative embodiments, it may be possible to use a current as an input control signal. The transconductance 35 amplifier in FIG. 2 converts the input voltage VCNTL into a differential current. If the control signal were already available as a differential current ICNTL, then the transconductance stage would not be necessary, since currents I23 and I24 of FIG. 2 would be available directly (e.g., ICNTL=I23−I24). This would eliminate the need to do a voltage-to-current conversion.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. An integrated circuit comprising:
   (a) a temperature-dependent variable gain amplifier (VGA); and
   (b) a temperature-compensation circuit configured to provide a temperature-dependent control voltage to the VGA to substantially compensate for the temperature dependence of the VGA, wherein the temperature-compensation circuit comprises:
      (1) a first stage comprising two transistors configured to receive a first differential current; and
      (2) a second stage comprising two transistors configured to receive a second differential current, wherein the two transistors of the first stage and the two transistors of the second stage are connected to form a loop configured to generate the temperature-dependent control voltage using only differential circuitry.

2. The invention of claim 1, wherein the temperature-compensation circuit is adapted to multiply a temperature-independent input signal by a value that is proportional to absolute temperature to generate the control voltage.

3. The invention of claim 2, wherein the temperature-compensation circuit comprises:
   (1) a current multiplier corresponding to the two transistors of the first stage and the two transistors of the second stage and adapted to multiply a temperature-independent differential current by a temperature-dependent differential current to generate a temperature-dependent multiplied current; and
   (2) a current-to-voltage converter adapted to convert the temperature-dependent multiplied current into the temperature-dependent control voltage.

4. The invention of claim 3, wherein the temperature-dependent differential current is proportional to absolute temperature.

5. The invention of claim 3, wherein the two transistors of the first stage and the two transistors of the second stage are two pairs of bipolar transistors.

6. The invention of claim 3, wherein the temperature-compensation circuit further comprises a temperature-independent current source adapted to generate the temperature-independent differential current and a temperature-dependent current source adapted to generate the temperature-dependent differential current.

7. The invention of claim 3, wherein:
   the temperature-independent input signal is a temperature-independent input voltage; and
   the temperature-compensation circuit fuirther comprises a transconductance amplifier adapted to convert the temperature-independent input voltage into the temperature-independent differential current.

8. The invention of claim 7, wherein:

the temperature-dependent differential current is proportional to absolute temperature;

the two transistors of the first stage and the two transistors of the second stage are two pairs of bipolar transistors; and the temperature-compensation circuit further comprises a temperature-independent current source adapted to generate the temperature-independent differential current and a temperature-dependent current source adapted to generate the temperature-dependent differential current.

9. The invention of claim 1, wherein the loop comprises only PN emitter base junctions.

10. The invention of claim 9, wherein the set of transistors in the loop consists of only the two transistors of the first stage and the two transistors of the second stage.

11. The invention of claim 1, wherein the set of transistors in the loop consists of only the two transistors of the first stage and the two transistors of the second stage.

12. The invention of claim 1, wherein the temperature-dependent control voltage is a differential voltage, both sides of which are generated directly from the loop.

13. An integrated circuit comprising:
   (a) a temperature-dependent VGA; and
   (b) a temperature-compensation circuit configured to provide a differential temperature-dependent control voltage to the VGA to substantially compensate for the temperature dependence of the VGA, wherein the temperature-compensation circuit comprises:
      (1) a first stage comprising two transistors configured to receive a first differential current; and
      (2) a second stage comprising two transistors configured to receive a second differential current, wherein the two transistors of the first stage and the two transistors of the second stage are connected to form a loop configured to directly generate the differential temperature-dependent control voltage.

14. The invention of claim 13, wherein the temperature-compensation circuit is adapted to multiply a temperature-independent input signal by a value that is proportional to absolute temperature to generate the control voltage.

15. The invention of claim 14, wherein the temperature-compensation circuit comprises:
   (1) a current multiplier corresponding to the two transistors of the first stage and the two transistors of the second stage and adapted to multiply a temperature-independent differential current by a temperature-dependent differential current to generate a temperature-dependent multiplied current; and
   (2) a current-to-voltage converter adapted to convert the temperature-dependent multiplied current into the temperature-dependent control voltage.

16. The invention of claim 15, wherein the temperature-dependent differential current is proportional to absolute temperature.

17. The invention of claim 15, wherein the temperature-compensation circuit further comprises a temperature-independent current source adapted to generate the temperature-independent differential current and a temperature-dependent current source adapted to generate the temperature-dependent differential current.

18. The invention of claim 15, wherein:

the temperature-independent input signal is a temperature-independent input voltage; and the temperature-compensation circuit further comprises a transconductance amplifier adapted to convert the temperature-independent input voltage into the temperature-independent differential current.

19. The invention of claim 13, wherein the loop comprises only PN emitter base junctions.

20. The invention of claim 13, wherein the set of transistors in the loop consists of only the two transistors of the first stage and the two transistors of the second stage.

* * * * *